US009552852B2

(12) United States Patent
Anderson et al.

(10) Patent No.: US 9,552,852 B2
(45) Date of Patent: Jan. 24, 2017

(54) DOPED METAL-INSULATOR-TRANSITION LATCH CIRCUITRY

(71) Applicant: GLOBALFOUNDRIES INC., Grand Cayman (KY)

(72) Inventors: Brent A. Anderson, Jericho, VT (US); Kota V. R. M. Murali, Bangalore (IN); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 21 days.

(21) Appl. No.: 14/534,205

(22) Filed: Nov. 6, 2014

(65) Prior Publication Data

US 2016/0133303 A1 May 12, 2016

(51) Int. Cl.
| | |
|---|---|
| *H01L 45/00* | (2006.01) |
| *H01L 27/105* | (2006.01) |
| *G11C 7/10* | (2006.01) |
| *H01L 21/768* | (2006.01) |
| *H03K 5/13* | (2014.01) |
| *H01L 27/24* | (2006.01) |
| *G11C 7/02* | (2006.01) |

(52) U.S. Cl.
CPC ............ *G11C 7/106* (2013.01); *G11C 7/02* (2013.01); *H01L 21/76895* (2013.01); *H01L 27/2436* (2013.01); *H01L 27/2463* (2013.01); *H01L 45/1206* (2013.01); *H01L 45/1233* (2013.01); *H01L 45/146* (2013.01); *H01L 45/16* (2013.01); *H03K 5/13* (2013.01)

(58) Field of Classification Search
None
See application file for complete search history.

(56) References Cited

U.S. PATENT DOCUMENTS

| | | | |
|---|---|---|---|
| 8,076,662 B2 | 12/2011 | Ramanathan et al. | |
| 8,362,477 B2 | 1/2013 | Barwicz et al. | |
| 8,551,809 B2 | 10/2013 | Kumar et al. | |
| 2008/0316807 A1 | 12/2008 | Hyun et al. | |
| 2009/0052297 A1 | 2/2009 | Ku et al. | |

(Continued)

OTHER PUBLICATIONS

Boriskov, et al., "Metal-insulator transition in electric field: A viewpoint from the switching effect", Petrozavodsk State University, Petrozavodsk, 185910, Russian Federation, Dated: Feb. 28, 2006, pp. 1-18.

(Continued)

*Primary Examiner* — Robert Bachner
*Assistant Examiner* — Molly Reida
(74) *Attorney, Agent, or Firm* — Anthony J. Canale

(57) ABSTRACT

Some embodiments of the present invention may include one, or more, of the following features, characteristics or advantages: (i) latch device including multiple Ecrit material regions all electrically connected to a common terminal (sometimes structured and shaped in the form of a storage plate conductor); (ii) bi-stable three-terminal latch device using two Ecrit property regions; (iii) three-terminal, two-Ecrit-region latch device where, for each Ecrit region, (Vdd−Vss) divided by (region thickness, dn) is greater than the region's Ecrit value; or (iv) use of multiple Ecrit material region latch devices to provide data storage instrumentality in a static memory device.

20 Claims, 5 Drawing Sheets

(56) References Cited

U.S. PATENT DOCUMENTS

| | | | |
|---|---|---|---|
| 2010/0034011 A1* | 2/2010 | Xi | G11C 11/5685 365/148 |
| 2013/0021835 A1 | 1/2013 | Hwang et al. | |
| 2013/0069964 A1 | 3/2013 | Wuu et al. | |
| 2013/0106480 A1 | 5/2013 | Ribeiro et al. | |
| 2014/0110765 A1* | 4/2014 | Murali | H01L 21/28088 257/288 |

OTHER PUBLICATIONS

Chae, et al., "Fabrication and Electrical Properties of Pure VO 2 Phase Films", Basic Research Laboratory, ETRI, Daejeon 305-350, Republic of Korea, Nov. 29, 2003, pp. 1-5.

Chudnovskiy, et al., "Switching device based on first-order metal-insulator transition induced by external electric field", "Future Trends in Microelectronics: the Nano Millennium", pp. 148-155, Ed by S. Luryi, J.M. Xu, A. Zaslavsky, Wiley Interscience, 2002, pp. 1-8.

Golan, et al., "Investigation of Phase Transition Mechanism in Vanadium Oxide Thin Films", Journal of Optoelectronics and Advanced Materials vol. 6, No. 1, Mar. 2004, p. 189-195.

Kim, et al., "Mechanism and observation of Mott transition in VO 2-based two- and three-terminal devices", New Journal of Physics, Received Sep. 24, 2003, Published May 17, 2004, pp. 1-19, <http://www.njp.org/>.

Liu, et al., "Terahertz-field-induced insulator-to-metal transition in vanadium dioxide metamaterial", Macmillan Publishers Limited, Jul. 19, 2012, vol. 487, Nature, pp. 345-348.

Yang, et al., "Metal-insulator transition characteristics of VO 2 thin films grown on Ge(100) single crystals", Journal of Applied Physics 108, 073708 (2010), © 2010 American Institute of Physics, Published online Oct. 11, 2010.

Zhan, et al., "The metal-insulator transition in VO 2 studied using terahertz apertureless near-field microscopy", Applied Physics Letters 91, 162110 (2007), © 2007 American Institute of Physics, Downloaded Oct. 22, 2007 to 128.42.12.211.

Zhou, et al., "Voltage-Triggered Ultrafast Phase Transition in Vanadium Dioxide Switches", IEEE Electron Device Letters, vol. 34, No. 2, Feb. 2013.

* cited by examiner

US 9,552,852 B2

DOPED METAL-INSULATOR-TRANSITION LATCH CIRCUITRY

BACKGROUND

The present invention relates generally to the field of latch circuitry, and more particularly to latch circuitry using doped Metal-Insulator-Transition (dMIT) material. In some conventional circuitry a flip flop is built on a latch.

At least one "Ecrit material" is known. Generally speaking, Ecrit material have electrical conduction properties that can vary corresponding to electric field conditions. More specifically, for purposes of this document, an "Ecrit material" is hereby defined to be any material which meets the following conditions: (i) acts as an electrical conductor when the voltage drop across the material is less than a threshold voltage (Vcritlo); and (ii) acts as an electrical insulator when the voltage drop across the material is greater than a threshold voltage (Vcrithi). In some Ecrit materials, Vcritlo is at least approximately equal to Vcrithi, which means a relatively abrupt change from conductor to insulator as electric field varies. In other Ecrit materials, there may be a substantial transition zone where electrical fields result in a potential somewhere between the Vcritlo and Vcrithi values. There may even exist Ecrit materials that are characterized by two Ecrit values due to hysteresis (that is, Vcrithi is less than Vcritlo). One specific example of a known Ecrit material is $dVO_2$ (doped vanadium (IV) oxide).

One known type of latch device is a two terminal latch that uses a single $dVO_2$ region (herein called, a "two-terminal $dVO_2$ latch device"). There are memory devices that use a set of two-terminal $dVO_2$ latch devices to each respectively store (in a volatile manner) a bit of binary data (that is, a 1 or a 0).

SUMMARY

According to an aspect of the present invention, an integrated circuit (IC) latch device includes: a first conductor coupled to a first potential level (Vss); a second conductor coupled to a second potential level (Vdd); an adjustable voltage conductor; a first layer of doped Metal-Insulator-Transition (dMIT) electrically connected between the first conductor and the adjustable voltage conductor; and a second layer of doped Metal-Insulator-Transition (dMIT) electrically connected between the second conductor and the adjustable voltage conductor.

According to a further aspect of the present invention, a static memory device includes: a plurality of latch devices structured, located or connected to store data according to latch states of the latch devices of the plurality of latch devices. Each latch device of the plurality of latch devices includes an integrated circuit (IC) device including: a first conductor coupled to a first potential level (Vss); a second conductor coupled to a second potential level (Vdd); an adjustable voltage conductor; a first layer of doped Metal-Insulator-Transition (dMIT) electrically connected between the first conductor and the adjustable voltage conductor; and a second layer of doped Metal-Insulator-Transition (dMIT) electrically connected between the second conductor and the adjustable voltage conductor.

According to a further aspect of the present invention, a method of making a latch device includes the following operations (not necessarily in the following order and it is noted that operations may overlap in time): (i) forming a first conductor as a layer in a laminate structure; (ii) forming a second conductor as a layer in the laminate structure; (iii) forming an adjustable voltage conductor as a layer in the laminate structure; (iv) electrically connecting a first layer of doped Metal-Insulator-Transition (dMIT) electrically connected between the first conductor and the adjustable voltage conductor; and (v) electrically connecting a second layer of doped Metal-Insulator-Transition (dMIT) between the second conductor and the adjustable voltage conductor.

DETAILED DESCRIPTION

Some embodiments of the present invention may include one, or more, of the following features, characteristics or advantages: (i) latch device including multiple Ecrit material regions all electrically connected to a common terminal (sometimes structured and shaped in the form of a storage plate conductor); (ii) bi-stable three-terminal latch device using two Ecrit property regions; (iii) three-terminal, two-Ecrit-region latch device where, for each Ecrit region, (Vdd-Vss) divided by (region thickness, dn) is greater than the region's Ecrit value; or (iv) use of multiple Ecrit material region latch devices to provide data storage instrumentality in a static memory device. In this context, "static" means that the latch will retain its state indefinitely while the power supply remains on, as opposed to a dynamic memory which requires periodic refreshing of state due to leakage of stored charge.

Figure 1:
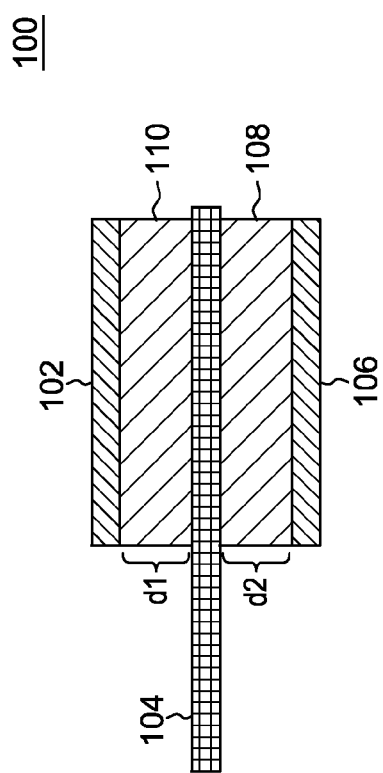
FIG. 1 is a cross-sectional view of a first embodiment of a device according to the present invention.

As shown in FIG. 1, latch device 100 includes: Vss-level conductor 102 (maintained at potential level Vss); storage plate conductor 104 (adjustable voltage level Vsp); Vdd-level conductor 106; dMIT region 108 (having thickness d2); and dMIT region 110 (having thickness d1). In this embodiment, both Vdd and Vss are positive voltages, and Vdd is larger than Vss. In this embodiment, components 102, 104, 106, 108, 110 are formed in laminate structure, as shown in FIG. 1. Conductors 102, 104 and 108 are the three terminals of this bi-stable, three-terminal latch device 100. In this embodiment, dMIT regions 108, 110 are both: (i) formed of the same Ecrit material (specifically $dVO_2$); (ii) characterized by identical Ecrit values (because they are formed of the same material, with the same dopants and doping levels); and (iii) equal in thickness (d1=d2). In this embodiment, for each dMIT region 108, 110, (Vdd−Vss) divided by (region thickness, dn) is greater than the regions' Ecrit value.

The "bi-stable" operation of device 100 will now be discussed. If the voltage level Vsp of storage plate conductor 104 is briefly driven up to the Vdd voltage level (for example, to store a binary 1), then: (i) dMIT region 108 will begin to act as a conductor because there will be very little voltage drop as between Vdd-level conductor 106 and storage plate conductor 104; (ii) dMIT region 110 will begin to act as an insulator because there will be a considerable voltage drop as between Vss-level conductor 102 and storage plate conductor 104; (iii) voltage level Vsp of storage plate conductor 104 will tend to remain at the relatively high Vdd level even if the storage plate conductor 104 stops having any sort of biasing power applied to it because: (a) it can draw current through conductive dMIT region 108 (which is at Vdd) to keep its potential nearly equal to Vdd level, and (b) it will not lose significant potential by leaking current through insulative dMIT region 110 to Vss-level conductor 102; and (iv) voltage level Vsp of storage plate conductor 104 will remain up at Vdd indefinitely. As a complementary operation, if the voltage level Vsp of storage plate 104 is briefly driven down to the Vss voltage level (for example, to store a binary 0), then: (i) dMIT region 110 will begin to act as a conductor because there will be very little voltage drop as between Vss-level conductor 102 and storage plate conductor 104; (ii) dMIT region 108 will begin to act as an insulator because there will be a considerable voltage drop as between Vdd-level conductor 106 and storage plate conductor 104; (iii) voltage level Vsp of storage plate conductor 104 will tend to remain at the relatively low Vss level even if the storage plate conductor stops having any sort of biasing power applied to it because: (a) it can drain current through conductive dMIT region 110 (which is at Vss) to keep its potential down at the Vss level, and (b) it will not gain potential by receiving leaked current through insulative dMIT region 108 from Vdd-level conductor 106; and (iv) voltage level Vsp of storage plate conductor 104 will remain down at Vss indefinitely. The two above operations can be alternately repeated to change the bi-stable (Vdd or Vss) value of Vsp, and thereby stably store a binary 1 or a binary 0.

As can be appreciated from the discussion of the previous paragraph, the bi-stability of device 100 is reliable and robust because the Ecrit material simultaneously electrically couples the storage plate to a conductor having its intended voltage and decouples the storage plate from the conductor having a different voltage. Also, Vdd and Vss are likely to be readily and reliably available throughout any device into which the latch is built (for example, a static memory device)—there is no need to provide or condition special gate voltages as in many conventional semiconductor devices that use non-Ecrit semiconductor materials. The robustness and reliability of the bi-stability can be especially helpful when it is considered that these latch devices are usually built at a very small scale so that they are generally susceptible to small manufacturing defects, performance problems caused by temperature or pressure variations, small powers supply system instabilities and the like—the degree of reliability and robustness of bi-stability can help prevent these potential problems from becoming actual problems that compromise actual performance of the latch device.

In this embodiment, terminals 102, 104, 106 are made of platinum and are 20 nm to 200 nm in thickness. Alternatively, the terminals could be made out of other materials and have different dimension(s). In many embodiments, including in device 100, the terminals are made of materials suitable for depositing as, or forming into generally planar laminate structures characteristic of conventional microelectronics. As mentioned above, the dMIT regions are made of $dVO_2$, a currently conventional doped metal-insulator transition material. Currently, conventional dopants include: W (tungsten), Nb (niobium), Ti (titanium), Cr (chromium), Al (aluminum) ion. Alternatively, other Ecrit materials (now known or to be developed in the future) may be used.

In this example: (i) thickness $d1=20$ nm; (ii) thickness $d2=20$ nm; (iii) Vdd=0.8V; (iv) Vss=a positive voltage below Vdd; (v) Ecrit=100 kV/cm; (vi) (Vcrit (d1))=0.2V; and (vii) (Vcrit(d2))=0.2V. Given these values, notice that the following inequalities hold: (Vdd−Vss)>(Ecrit×d1)>(Ecrit×d2). Alternatively, in some latches according to the present invention: (i) d1 is not equal to d2; and (ii) two different Ecrit materials, with different Ecrit values, are used.

Figure 2:
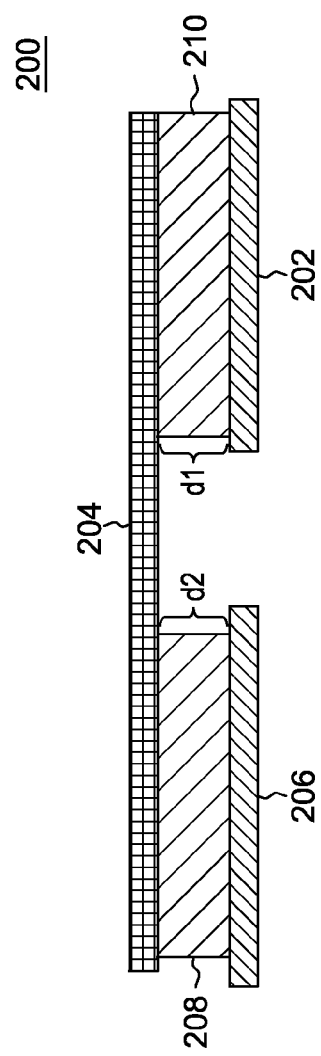
FIG. 2 is a cross-sectional view of a second embodiment of a device according to the present invention.

As shown in FIG. 2, latch device 200 includes: Vss-level conductor 202 (maintained at potential level Vss); storage plate conductor 204 (adjustable voltage level Vsp); Vdd-level conductor 206; dMIT region 210 (having thickness d1); and dMIT region 208 (having thickness d2). In this embodiment, both Vdd and Vss are positive voltages, and Vdd is larger than Vss. Device 200 is electrically similar to device 100, but the physical layout of the layers is different, with both dMIT regions 208, 210 being on the same side of storage plate conductor 204. Still, there are two separate and distinct dMIT regions in this embodiment, just as there are in device 100.

Figure 3:
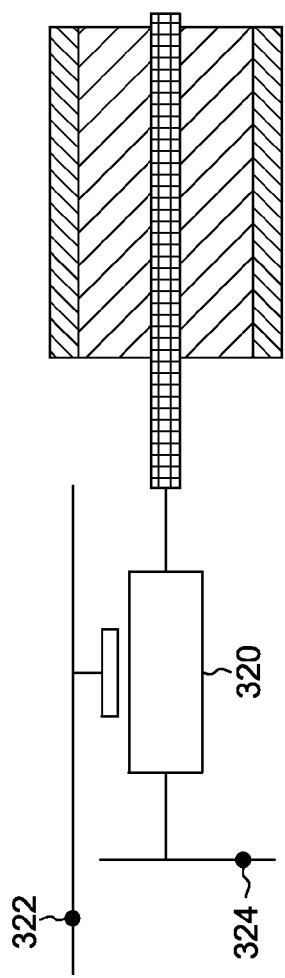
FIG. 3 is a cross-sectional view of a third embodiment of a device according to the present invention.
Figure 4:
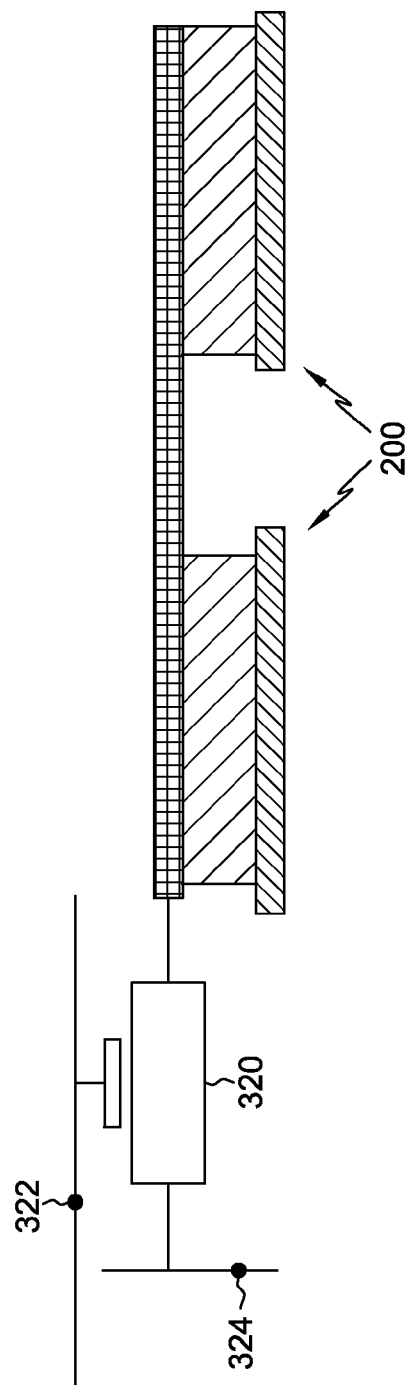
FIG. 4 is a cross-sectional view of a fourth embodiment of a device according to the present invention.

As shown in FIG. 3, latch device assembly 300 includes: latch device 100 (previously discussed in connection with FIG. 1); I/O (input/output) transistor 320; word line 322; and bit line 324. As shown in FIG. 4, latch device assembly 400 includes: latch device 200 (previously discussed in connection with FIG. 2); I/O (input/output) transistor 320; word line 322; and bit line 324. In assemblies 300 and 400, the addition of the word lie, the bit line and the I/O transistor allows the formation of large arrays of latches so that many bits of data may be stored and accessed in a static memory device.

Figure 5:
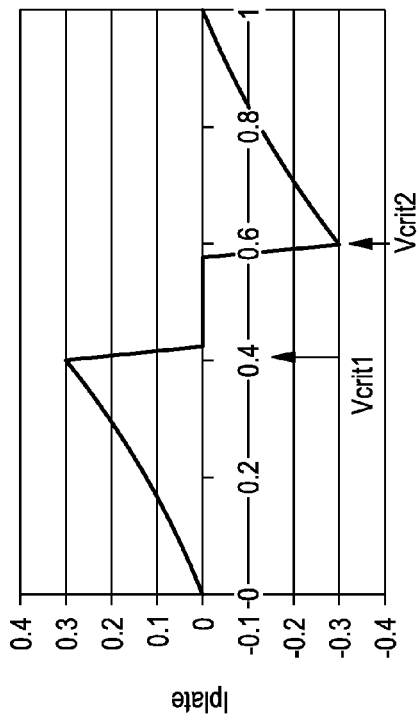
FIG. 5 is a first graph view showing information that is generated by or helpful in understanding embodiments of the present invention.
Figure 6:
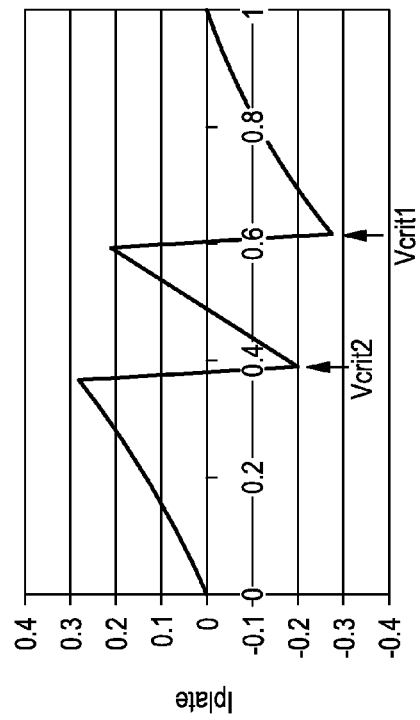
FIG. 6 is a second graph view showing information that is generated by or helpful in understanding embodiments of the present invention.

According to one embodiment of the present invention, there are at least two types of dMIT latches: (i) type A design where (first region Ecrit value plus second region Ecrit value) is less than (Vdd minus Vss); and (ii) type B design where (first region Ecrit value plus second region Ecrit value) is greater than (Vdd minus Vss). Transfer characteristics for an embodiment according to a type A design latch according to the present invention is shown in graph 500 of FIG. 5. As shown in graph 500, there is a tri-state region so that the storage plate conductor of the latch can be stably maintained at three different voltage levels. Transfer characteristics for an embodiment according to a type B design latch according to the present invention is shown in graph 600 of FIG. 6. As shown in graph 600: (i) there is a region with high short-circuit current when switching; (ii) it is faster; (iii) it has lower Vdd operation; (iv) uses higher power; and (v) has reduced immunity to noise disturbances. As shown in graphs 500 and 600, both type A and type B designs are characterized by a Vcrit1 value and a Vcrit2 value.

Figure 7:
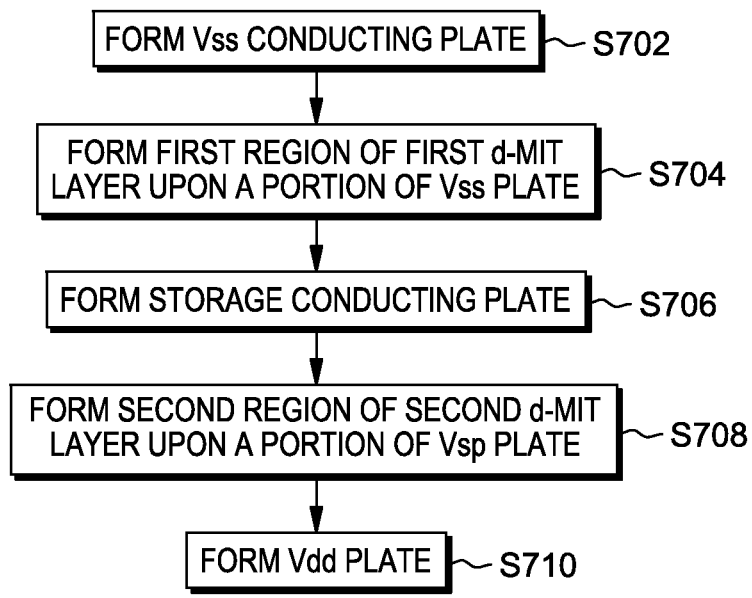
FIG. 7 is a first flow chart view of a first embodiment of a method according to the present invention.

FIG. 7 shows flow chart 700 depicting a method according to the present invention. This method of fabricating a monolithic MIT based array will be discussed in the following paragraphs with extensive reference to FIG. 1.

The fabrication process begins with step S702 forming Vss-level conductor 102 according to known microelectronic fabrication techniques and with conventional fabrication machinery.

Fabrication continues with step S704 forming the dMIT region 110 according to known microelectronic fabrication techniques and with conventional fabrication machinery.

Fabrication continues with step S706 forming storage plate conductor 104 according to known microelectronic fabrication techniques and with conventional fabrication machinery.

Fabrication continues where step S708 forms the dMIT region 108 according to known microelectronic fabrication techniques and with conventional fabrication machinery.

Fabrication concludes where step S710 forms Vdd-level conductor 106 on top of dMIT 108 according to known microelectronic fabrication techniques and with conventional fabrication machinery.

Figure 8:
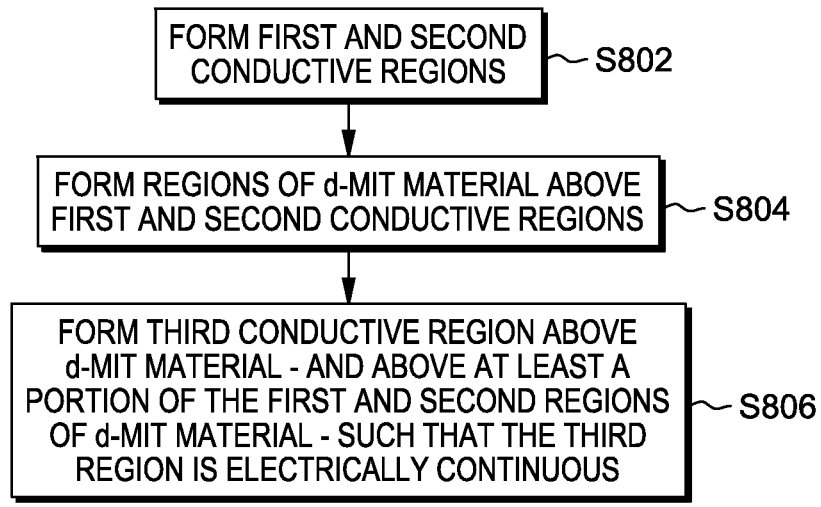
FIG. 8 is a second flow chart view of a second embodiment of a method according to the present invention.

FIG. 8 shows flow chart 800 depicting a method according to the present invention. This method of fabricating a monolithic MIT based array will be discussed in the following paragraphs with extensive reference to FIG. 2.

The fabrication process begins where step S802 forms the first and second conductive regions, Vss-level conductor 202 and Vdd-level conductor 206.

Fabrication continues where step S804 forms dMIT regions 208, 210.

Fabrication concludes where step S806 forms storage plate conductor 206 according to known microelectronic fabrication techniques and with conventional fabrication machinery. This fabrication is performed in a manner such that storage plate conductor 204 is electrically continuous. Although storage plate conductor 204 of device 200 is a single unitary layer of material, it could be formed in segments electrically connections (for example, metal leads) between the segments.

Some embodiments of the present invention eliminate the need for CMOS (Complementary metal-oxide-semiconductor) microcircuitry which may be required in assemblies of conventional two-terminal Ecrit material region latch devices.

Figure 9:
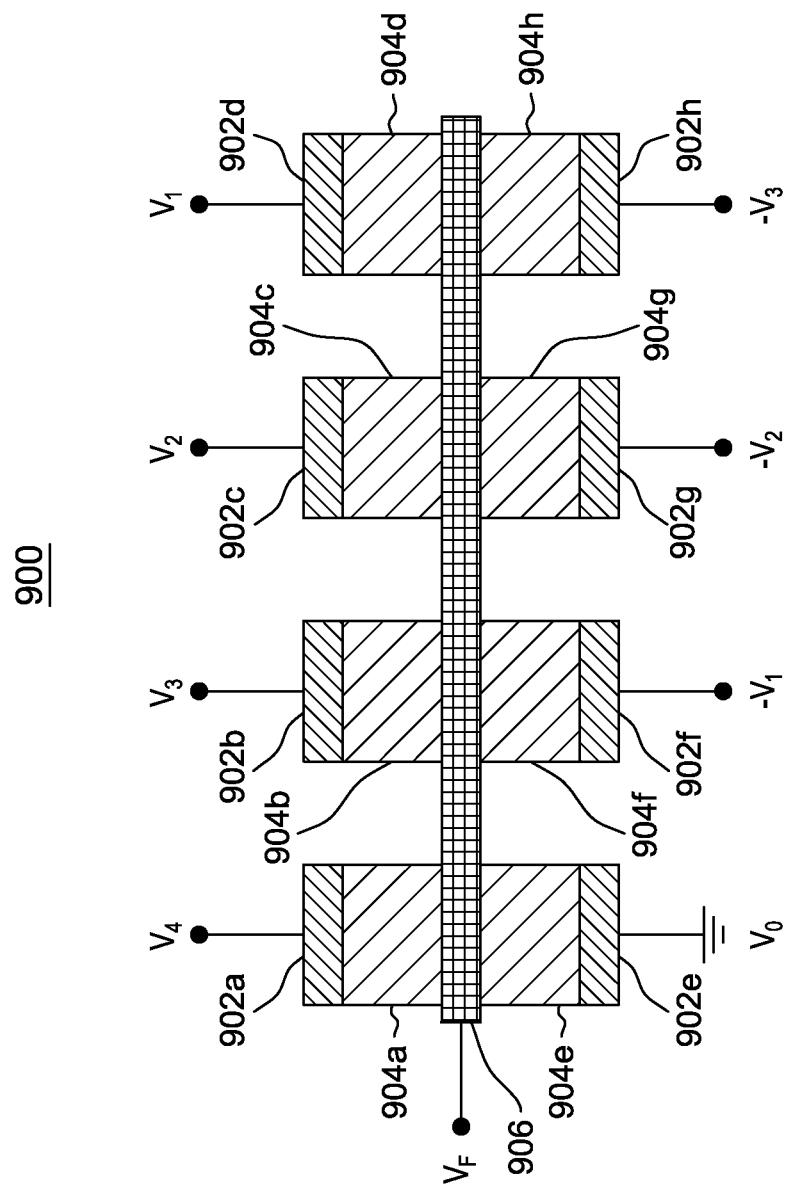
FIG. 9 is a cross-sectional view of a fifth embodiment of a device according to the present invention.

As shown in FIG. 9, latch device 900 includes eight fixed voltage terminals 902a to h (respectively at voltages $VS_1$, $VD_1$, $VS_2$, $VD_2$, $VS_3$, $VD_3$, $VS_4$, $VD_4$); eight Ecrit material regions 904a to h; and floating voltage terminal 906 (at adjustable voltage $V_F$). Each set voltage pairs, $VS_i$, $VD_i$, i=1, 2, 3, 4, can be set such that $VS_{(i+1)} > VS_i + VC_{(i+1)} + VC_i$, where VCi is the critical transition potential of the corresponding metal/dMIT stack with respect to $VS_i$ (e.g., $VC_1$ is the voltage above the $VS_1$ to switch region 902a off), and $VD_{(i+1)} < VD_i - VC_{(i+1)} - VC_i$. These voltage conditions ensure that no two individual latches are simultaneously active, and hence conflicting with one another. Device 900 can be adjusted to any one of eight voltage levels ($V_4$, $V_3$, $V_2$, $V_1$, $V_0$, $-V_1$, $-V_2$, $-V_3$), meaning that it is octo-stable and can hold four bits of data.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit latch device comprising:
a first conductor maintained at a first voltage level;
a second conductor maintained at a second voltage level that is higher than the first voltage level;
an adjustable voltage conductor electrically connected to a transistor;
a first layer of doped Metal-Insulator-Transition material electrically connected between the first conductor and the adjustable voltage conductor; and
a second layer of doped Metal-Insulator-Transition material electrically connected between the second conductor and the adjustable voltage conductor,
the adjustable voltage conductor being biased by an output voltage of the transistor, and
the output voltage being at either the first voltage level or the second voltage level such that, when the adjustable voltage conductor is at the first voltage level, the first layer of doped Metal-Insulator-Transition material is conductive and the second layer of doped Metal-Insulator-Transition material is insulative and such that, when the adjustable voltage conductor is at the second voltage level, the first layer of doped Metal-Insulator-Transition material is insulative and the second layer of doped Metal-Insulator-Transition material is conductive.

2. The IC latch device of claim 1,
the first voltage level and the second voltage level being positive voltage levels, and
the adjustable voltage conductor having a floating voltage value when unbiased and the floating voltage value being determined by electrical energy communicated through the first layer of doped Metal-Insulator-Transition material and the second layer of doped Metal-Insulator-Transition material such that, when the first layer of doped Metal-Insulator-Transition material is conductive, the second layer of doped Metal-Insulator-Transition material is insulative and the adjustable voltage conductor is unbiased, the floating voltage value will approximate the first voltage level and such that, when the second layer of doped Metal-Insulator-Transition material is conductive, the first layer of doped Metal-Insulator-Transition material is insulative and the adjustable voltage conductor is unbiased, the floating voltage value will approximate the second voltage level.

3. The integrated circuit latch device of claim 2, the first layer of doped Metal-Insulator-Transition material and the second layer of doped Metal-Insulator-Transition material being chemically identical materials.

4. The integrated circuit latch device of claim 1,
the first layer of doped Metal-Insulator-Transition material being conductive when a potential greater than a first threshold voltage, and less than or equal to a first critical voltage, is applied across the first layer of doped Metal-Insulator-Transition material; and
the first layer of doped Metal-Insulator-Transition material being insulative when a potential greater than the first critical voltage is applied across the first layer of doped Metal-Insulator-Transition material.

5. The integrated circuit latch device of claim 4, wherein:
the second layer of doped Metal-Insulator-Transition material being conductive when a potential greater than a second threshold voltage, and less than or equal to a second critical voltage, is applied across the second layer of doped Metal-Insulator-Transition material; and
the second layer of doped Metal-Insulator-Transition material being insulative when a potential greater than the second critical voltage is applied across the second layer of doped Metal-Insulator-Transition material.

6. The integrated circuit latch device of claim 5, the first critical voltage being equal to the second critical voltage.

7. The integrated circuit latch device of claim 1, wherein a tri-state region of operation is defined for potential values applied by the adjustable voltage conductor between a first critical voltage and a second critical voltage, where the second critical voltage is greater than the first critical voltage.

8. The integrated circuit latch device of claim 1, the first layer of doped Metal-Insulator-Transition material and the second layer of doped Metal-Insulator-Transition material each being doped vanadium (IV) oxide.

9. The integrated circuit latch device of claim 1, the first layer of doped Metal-Insulator-Transition material having a first thickness and the second layer of doped Metal-Insulator-Transition material having a second thickness that is different from the first thickness.

10. A static memory device comprising:
a plurality of latch devices structured, located or connected to store data according to latch states of the latch devices of the plurality of latch devices;
each latch device of the plurality of latch devices comprising:
a first conductor maintained at a first voltage level;
a second conductor maintained at a second voltage level that is higher than the first voltage level;
an adjustable voltage conductor electrically connected to a transistor;
a first layer of doped Metal-Insulator-Transition material electrically connected between the first conductor and the adjustable voltage conductor; and
a second layer of doped Metal-Insulator-Transition material electrically connected between the second conductor and the adjustable voltage conductor,
the adjustable voltage conductor being biased by an output voltage of the transistor, and
the output voltage being at either the first voltage level or the second voltage level such that, when the adjustable voltage conductor is at the first voltage level and storing a binary 0, the first layer of doped Metal-Insulator-Transition material is conductive and the second layer of doped Metal-Insulator-Transition material is insulative and such that, when the adjustable voltage conductor is at the second voltage level and storing a binary 1, the first layer of doped Metal-Insulator-Transition material is insulative and the second layer of doped Metal-Insulator-Transition material is conductive.

11. The static memory device of claim 10,
the first voltage level and the second voltage level being positive voltage levels, and
the adjustable voltage conductor having a floating voltage value when unbiased and the floating voltage value being determined by electrical energy communicated through the first layer of doped Metal-Insulator-Transition material and the second layer of doped Metal-Insulator-Transition material such that, when the first layer of doped Metal-Insulator-Transition material is conductive, the second layer of doped Metal-Insulator-Transition material is insulative and the adjustable voltage conductor is unbiased, the floating voltage value will approximate the first voltage level and such that, when the second layer of doped Metal-Insulator-Transition material is conductive, the first layer of doped Metal-Insulator-Transition material is insulative and the adjustable voltage conductor is unbiased, the floating voltage value will approximate the second voltage level.

12. The static memory device of claim 11, the first layer of doped Metal-Insulator-Transition material and the second layer of doped Metal-Insulator-Transition material being chemically identical materials.

13. The static memory device of claim 10,
the first layer of doped Metal-Insulator-Transition material being conductive when a potential greater than a first threshold voltage, and less than or equal to a first critical voltage, is applied across the first layer of doped Metal-Insulator-Transition material; and
the first layer of doped Metal-Insulator-Transition material being insulative when a potential greater than the first critical voltage is applied across the first layer of doped Metal-Insulator-Transition material.

14. The static memory device of claim 13,
the second layer of doped Metal-Insulator-Transition material being conductive when a potential greater than a second threshold voltage, and less than or equal to a second critical voltage, is applied across the second layer of doped Metal-Insulator-Transition material; and
the second layer of doped Metal-Insulator-Transition material being insulative when a potential greater than the second critical voltage is applied across the second layer of doped Metal-Insulator-Transition material.

15. The static memory device of claim 14, the first critical voltage being equal to the second critical voltage.

16. The static memory device of claim 10, wherein, for each IC device, a tri-state region of operation is defined for potential values applied by the adjustable voltage conductor between a first critical voltage and a second critical voltage, where the second critical voltage is greater than the first critical voltage.

17. The static memory device of claim 10, the first layer of doped Metal-Insulator-Transition material and the second layer of doped Metal-Insulator-Transition material each being doped vanadium (IV) oxide.

18. The static memory device of claim 10, the first layer of doped Metal-Insulator-Transition material having a first thickness and the second layer of doped Metal-Insulator-Transition material having a second thickness that is different from the first thickness.

19. A method comprising:
forming a laminate structure comprising:
a first conductor;
a second conductor as a layer;
an adjustable voltage conductor as a layer in the laminate structure;
a first layer of doped Metal-Insulator-Transition material between the first conductor and the adjustable voltage conductor; and
a second layer of doped Metal-Insulator-Transition material between the second conductor and the adjustable voltage conductor;
maintaining the first conductor at a first voltage level;
maintaining the second conductor at a second voltage level that is higher than the first voltage level; and
electrically connecting the adjustable voltage conductor to a transistor,
the adjustable voltage conductor being biased by an output voltage of the transistor, and
the output voltage being at either the first voltage level or the second voltage level such that, when the adjustable voltage conductor is at the first voltage level, the first layer of doped Metal-Insulator-Transition material is conductive and the second layer of doped Metal-Insulator-Transition material is insulative and such that, when the adjustable voltage conductor is at the second voltage level, the first layer of doped Metal-Insulator-Transition material is insulative and the second layer of doped Metal-Insulator-Transition material is conductive.

20. The method of claim 19, the first layer of doped Metal-Insulator-Transition material having a first thickness and the second layer of doped Metal-Insulator-Transition material having a second thickness that is different from the first thickness.

\* \* \* \* \*